United States Patent
Ikeda et al.

(10) Patent No.: US 8,922,266 B2
(45) Date of Patent: Dec. 30, 2014

(54) CALIBRATION CIRCUIT

(71) Applicant: MegaChips Corporation, Yodogawa-ku (JP)

(72) Inventors: Takashi Ikeda, Chiba (JP); Masato Yamaguchi, Naha (JP)

(73) Assignee: MegaChips Corporation, Yodogawa-ku (JP)

( * ) Notice: Subject to any disclaimer, the term of this patent is extended or adjusted under 35 U.S.C. 154(b) by 53 days.

(21) Appl. No.: 13/765,971

(22) Filed: Feb. 13, 2013

(65) Prior Publication Data

US 2013/0207711 A1 Aug. 15, 2013

(30) Foreign Application Priority Data

Feb. 13, 2012 (JP) ................... 2012-028197

(51) Int. Cl.
*G06G 7/19* (2006.01)
*H03K 17/14* (2006.01)
*G01R 27/02* (2006.01)

(52) U.S. Cl.
CPC .............. *H03K 17/145* (2013.01); *G01R 27/02* (2013.01)
USPC ........................................ 327/344; 327/553

(58) Field of Classification Search
None
See application file for complete search history.

(56) References Cited

U.S. PATENT DOCUMENTS

| | | | | |
|---|---|---|---|---|
| 6,803,713 | B2 * | 10/2004 | Takahashi et al. | 313/402 |
| 6,968,167 | B1 * | 11/2005 | Wu et al. | 455/251.1 |
| 7,561,861 | B2 | 7/2009 | Kim et al. | |
| 7,755,398 | B2 * | 7/2010 | Han et al. | 327/77 |
| 7,944,270 | B2 | 5/2011 | Denier et al. | |
| 2005/0240368 | A1 * | 10/2005 | Pan et al. | 702/106 |
| 2007/0279032 | A1 * | 12/2007 | Chang et al. | 323/315 |
| 2008/0221823 | A1 * | 9/2008 | Confalonieri et al. | 702/107 |
| 2009/0045880 | A1 * | 2/2009 | Vanselow et al. | 331/25 |
| 2009/0051401 | A1 * | 2/2009 | Confalonieri et al. | 327/306 |
| 2009/0096488 | A1 * | 4/2009 | Han et al. | 327/77 |
| 2013/0033307 | A1 * | 2/2013 | Lin | 327/553 |

FOREIGN PATENT DOCUMENTS

| | | |
|---|---|---|
| JP | A-2001-318111 | 11/2001 |
| JP | A-2008-537668 | 9/2008 |
| JP | A-2010-141651 | 6/2010 |

* cited by examiner

*Primary Examiner* — Tuan T Lam
(74) *Attorney, Agent, or Firm* — Oblon, Spivak, McClelland, Maier & Neustadt, L.L.P.

(57) ABSTRACT

A first constant voltage is supplied to a variable capacitance in a switched capacitor, and the variable capacitance is effectively charged to the first constant voltage in each cycle of a sampling clock. A current generated by charging the calibration resistance is averaged, and a resultant current is compared against a current generated by applying a second constant voltage to a resistance. The capacitance value of the variable capacitance is adjusted in accordance with a result of the comparison. Thus the variable capacitance is calibrated so as to have a target value.

15 Claims, 10 Drawing Sheets

FIG.12A
Related art
(at duty 5:5)

FIG.12B
Related art
(at duty 6:4)

FIG.13A (at duty 5:5)

FIG.13B (at duty 6:4)

US 8,922,266 B2

1

CALIBRATION CIRCUIT

This application claims priority from Japanese Patent Application No. 2012-028197, filed on Feb. 13, 2012, which is hereby incorporated by reference in its entirety.

BACKGROUND

This disclosure relates to a calibration circuit capable of achieving a desired RC time constant by adjusting one of a resistance value and a capacitance value. The calibration circuit has a simple configuration and accurately achieves the desired RC time constant without requiring neither of an accurate manufacturing process and an accurate sampling clock signal.

<First Conventional Art>

A first conventional art (Japanese Unexamined Patent Application Publication (Translation of PCT Application) No. 2008-537668) provides temperature compensation for a resistance value. It implements adjustment of a time constant by automatic switching of a value of a resistance or a capacitance.

Figure 8:
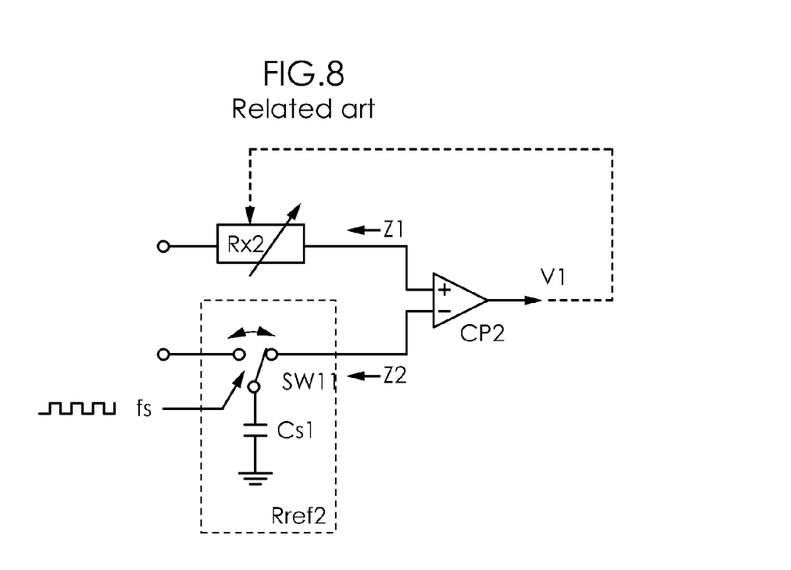
FIG. 8 is a circuit diagram of an RC calibration circuit in a first conventional art.

FIG. 8 illustrates a basic concept of the first conventional art. The first conventional art aims at monitoring and cancelling the temperature dependence of a resistive device during an actual operation. The first conventional art maintains a resistance at a stable resistance value.

The target of calibration in the illustrated arrangement is the resistance Rx2 having a resistance value dependent on the voltage and temperature. The arrangement compares impedance Z1 of the resistance to be calibrated Rx2 and reference impedance Z2 of a reference resistance Rref2, which is provided by a switched capacitor in which a low temperature-dependent fixed capacitance Cs1 is charged and discharged using a sampling clock fs. The arrangement compare the impedances by use of a comparator CP2 that outputs a voltage V1 indicating the difference, that is, the amount of change in the impedance Z1 cause by the temperature dependence. The arrangement adjusts a value of the resistance to be calibrated Rx2 using the voltage V1.

The resistance to be calibrated Rx2 may be a replica of a resistance actually used in a main circuit. The result of the calibration can be reflected to the actual resistance. Alternatively, a resistance in an actual main route can be used as the target, and the resistance can be directly calibrated.

Figure 9:
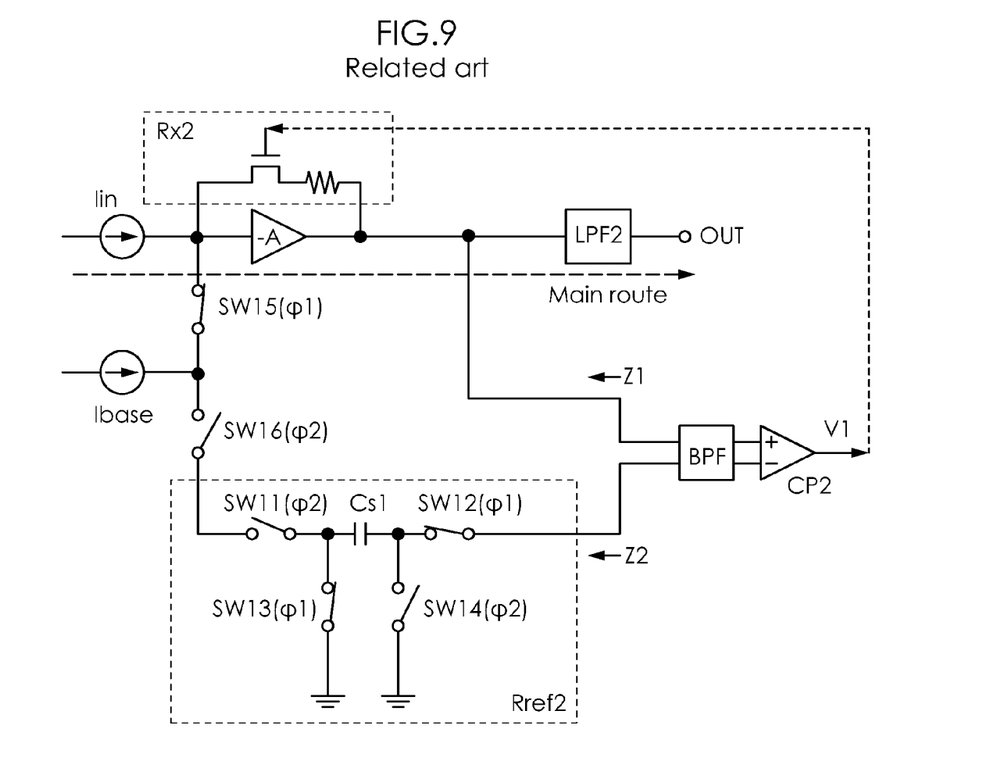
FIG. 9 is a specific circuit diagram of the RC calibration circuit illustrated in FIG. 8.

FIG. 9 illustrates a specific example of the first conventional art. The reference resistance Rref2 is provided by a switched capacitor including switches SW11 to SW14 and a fixed capacitance Cs1. The switches SW12 and SW13 turn on and off with a sampling clock $\phi 1$ having a sampling frequency fs. The switches SW11 and SW14 turn on and off with a sampling clock $\phi 2$. The sampling clock $\phi 2$ is in an opposite phase to the sampling clock $\phi 1$. Switches SW15 and SW16 supply a current Ibase, which is supplied from a comparison signal source, to a main route that contains the resistance to be calibrated Rx2 and to a reference route that contain the reference resistance Rref2.

The sampling frequency fs of the sampling clocks $\phi 1$ and $\phi 2$ is sufficiently spaced away from a signal frequency band $(f_L - f_H)$ of the main route, which extends from the resistance to be calibrated Rx2, through a low-pass filter LPF2. to an output terminal OUT. That is, $f_L < f_H < fs$, where $f_H$ denotes a signal frequency of the main route, and $f_L$ denotes a cut-off frequency of the low-pass filter LPF2.

In FIG. 9, the fixed capacitance Cs1 in the reference resistance Rref2 is charged and discharged with a cycle of the sampling frequency fs. As a result, impedance of the reference route is $|Z2|=1/Cs1 \cdot 2T\pi fs$. Similarly, the impedance of the main route, which has the resistance to be calibrated Rx2 is $Z1 = Rx2$.

A variation in the value of the resistance to be calibrated Rx2 can be detected by a comparison between the impedances Z1 and Z2. In actual, however, the impedances Z1 and Z2 include frequency components other than the sampling frequency fs, and these components degrade the accuracy of the comparison.

Thus, a band-pass filter BPF may be disposed before the comparator CP2 and frequency components of the impedances Z1 and Z2 at the desired sampling frequency fs are compared. Thereby, an accurate comparison voltage V1 may be generated and a control signal to adjust the value of the resistance to be calibrated Rx2 can be properly fed back. That is, by comparing for the components at the sampling frequency fs, a comparison between the impedances generated by the current Ibase is made.

A signal generated by the current Ibase is added to the path of the main route as a noise. The noise signal can be removed using a simple low-pass filter LPF2 by sufficiently separating the frequencies $f_H$ and fs away from each other.

<Second Conventional Art>

In a second conventional art (for example, Japanese Unexamined Patent Application Publication No. 2010-141651), a time constant of a filter, which is determined by a resistance and a capacitance, is adjusted.

Figure 10:
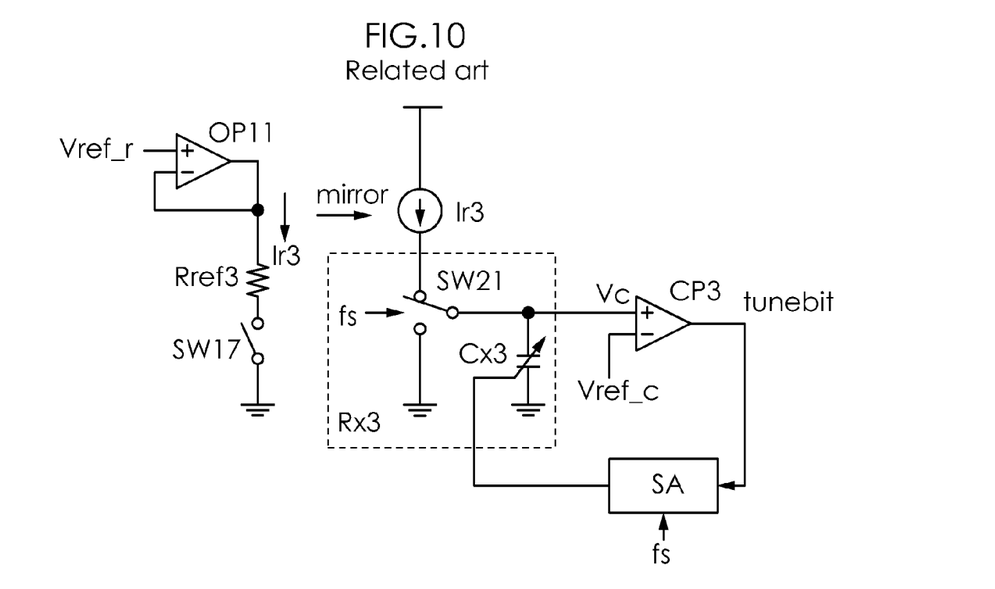
FIG. 10 is a circuit diagram of an RC calibration circuit in a second conventional art.

FIG. 10 illustrates a basic concept of the second conventional art. A voltage between terminals of a reference resistance Rref3 is controlled at a reference voltage Vref_r by an operational amplifier OP11, and a current Ir3 passing through the reference resistance Rref3 is generated. A resistance to be calibrated Rx3 is a switched capacitor including a switch SW21 and a variable capacitance Cx3, which is repeatedly charged and discharged with a current generated by mirroring the current Ir3.

An averaged detection voltage Vc generated by charging and discharging the variable capacitance Cx3 is compared against a reference voltage Vref_c (=Vref_r) by a comparator CP3. A result of the comparison is output and held as a tunebit. The tunebit is supplied to a search circuit SA configured to search for a value of the variable capacitance Cx3 that generates the detection voltage Vc equal to the reference voltage Vref_c. After the completion of comparison, the turnbit is supplied to a variable capacitance (not illustrated) in an actual circuitry, and the capacitance value of this variable capacitance is determined.

The first conventional art needs the band-pass filter BPF conforming to the sampling frequency.

The first and second conventional arts achieve a target resistance value or a target time constant, which is a product of a resistance value and a capacitance value, by comparing an impedance of the resistance and an impedance of the capacitance, or an equivalent resistance of a switched capacitor, at a sampling frequency fs. The voltage and current used in the comparison of impedances are generated using a sampling clock. It is assumed that the sampling clock has an ideal waveform. Thus, the first and the second conventional arts need a sampling clock having an ideal duty ratio maintained with high accuracy.

First, the first conventional art requires that the amount of current Ibase supplied to the path of the resistance to be calibrated Rx2 and that supplied to the path of the reference resistance Rref2 be equivalent or be at a constant ratio. If this is not the case, voltage or amount of current generated by the resistance to be calibrated Rx2 and the that generated by the reference resistance Rref2 is converted in accordance with the ratio of the supplied currents. Thus, there is an error between a target value and an actual value. These situations are briefly described with reference to FIGS. 11A to 11C.

Figure 11A:
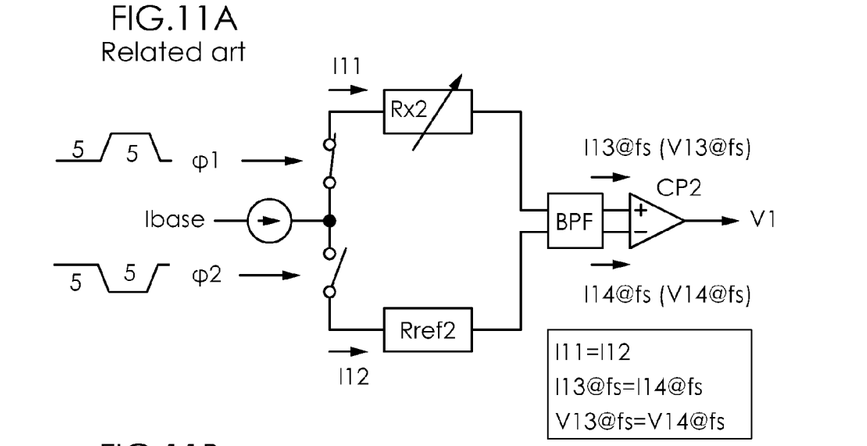
FIGS. 11A to 11C are illustrations for describing an issue in the first conventional art.
Figure 11B:
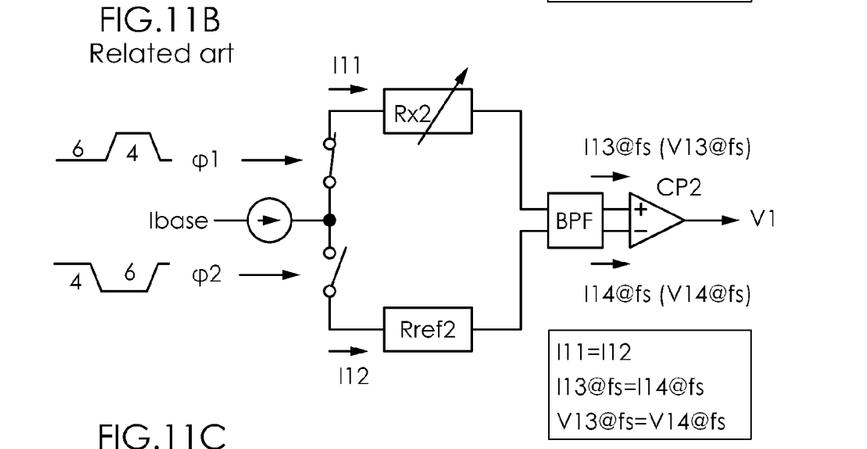

FIG. 11A illustrates an ideal case. Exactly evenly divided currents are supplied with a duty ratio of 50% to the path of the resistance to be calibrated Rx2 and to the reference resistance Rref2, i.e., I11=I12. In this case, the amounts of currents I13 and I14 (or voltages V13 and V14) supplied through the path of the resistance to be calibrated Rx2 and through the path of the reference resistance Rref2, which are used in comparison in the comparator CP2, are the same. As a result, the comparison can be made properly. The situation is the same when exactly evenly divided currents I11 and I12 are supplied with a duty ratio other than 50%, e.g., with a duty ratio of 40% as illustrated in FIG. 11B.

Figure 11C:
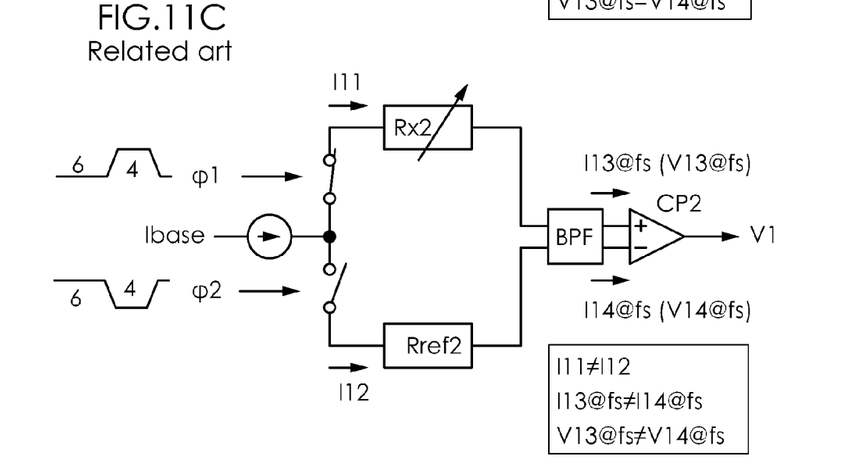

In contrast, as illustrated in FIG. 11C, when there is a difference between the amount of current supplied to the path of the resistance to be calibrated Rx2 and that to the path of the reference resistance Rref2 (I11≠I12), the values used in comparison in the comparator CP2 are different. That is, I13≠I14, (or V13≠V14), and the difference in duty ratio affects the signal strength.

For example, if the duty ratio is unbalanced at 6:4 (or 7:3), a difference of approximately 5% (or 20%) is present in the currents supplied to the paths. This means that, in an attempt to adjust the resistance to be calibrated Rx2 to a resistance value of 1 kΩ, the resistance value varies from 950Ω to 1050Ω (or 800Ω to 1200Ω).

In the case of the second conventional art, the duty ratio of the sampling clock having the sampling frequency fs needs to be exactly 5:5. If this is not the case, there is an error in the charges charged in the variable capacitance Cx3 illustrated in FIG. 10, and the detection voltage Vc is not properly generated, as in the case of the first conventional art. As a result, the cutoff frequency of the RC filter adjusted to a capacitance equivalent to the variable capacitance Cx3 causes an error corresponding to the unbalanced duty ratio.

The first and second conventional arts utilize a constant-current source to charge a capacitance in the switched capacitor. As a result, the capacitance is overcharged and a voltage generated across the capacitance increases with an increase in the charging time. Accordingly, if the duty ratio is unbalanced, the voltage generated by charging the capacitance differs, in comparison with the current or voltage generated when the duty ratio is at a predetermined value.

SUMMARY

Accordingly, an exemplary object of this disclosure is to provide a calibration circuit and a calibration method that can make proper comparison without being affected by an unbalanced duty ratio of a sampling clock. Another exemplary object of this disclosure is to provide a semiconductor integrated circuit that includes a circuitry including a capacitance and a resistance that determines an RC time constant and the calibration circuit.

According to an exemplary embodiment, a first capacitance of a switched capacitor is effectively charged to a first constant voltage during a charging period and effectively discharged to a first reference voltage during a discharging period in each cycle of a sampling clock. Accordingly, a capacitance value or a resistance value can be calibrated to a precise value without the need for a sampling clock having a precise duty ratio. As a result, a stable characteristic such as a filter characteristic of a circuitry in a semiconductor integrated circuit independent of variations in the fabrication process can be achieved.

Exemplary embodiments according to this disclosure provide a calibration circuit including a switched capacitor, an averaging circuit, a first resistance, a comparing circuit, and an adjusting circuit. The switched capacitor includes a first capacitance, a charging switch that supplies a first constant voltage to the first capacitance, and a discharging switch that supplies a first reference voltage to the first capacitance. The switched capacitor is supplied with a sampling clock having a sampling frequency so that the charging and discharging switches alternately supply the first constant voltage for a charging period during which a charging current flows into the first capacitance and the first reference voltage for a discharging period in each cycle of the sampling clock such that the first capacitance is effectively charged to the first constant voltage during the charging period and effectively discharged to the first reference voltage during the discharging period. The averaging circuit averages the charging current to generate a first current. The first resistance to which a second constant voltage is supplied so that a second current flows. The comparing circuit compares the first current and the second current to generate a comparison result. The adjusting circuit adjusts a value of one of the first resistance and the first capacitance in accordance with the comparison result.

DETAILED DESCRIPTION OF EMBODIMENTS

Figure 1:
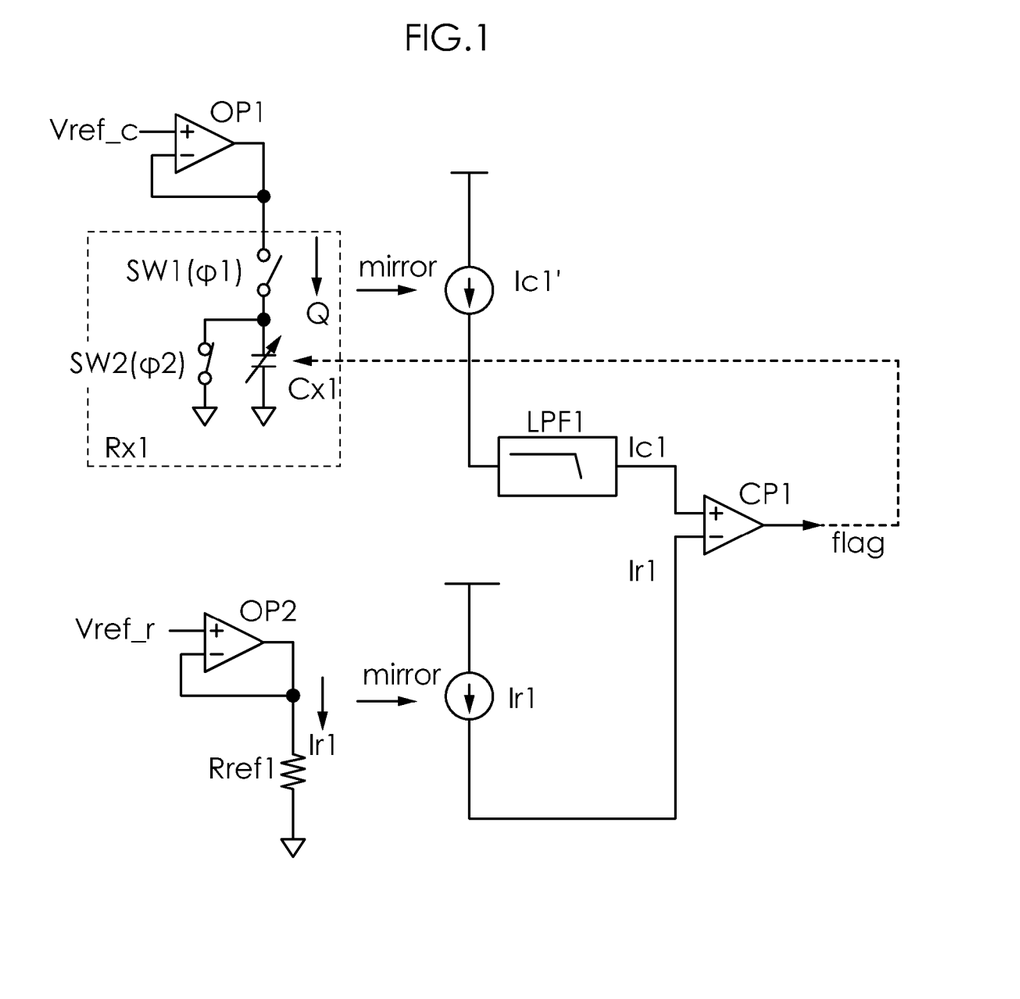
FIG. 1 illustrates a principle of an RC calibration circuit according to the present invention.

FIG. 1 illustrates a principle of an RC calibration circuit according to this disclosure. An operational amplifier OP1 includes a non-inverting input terminal configured to receive a reference voltage Vref_c and an inverting input terminal connected to an output terminal. An operational amplifier OP2 includes a non-inverting input terminal configured to receive a reference voltage Vref_r and an inverting input terminal connected to an output terminal. In an exemplary calibration circuit, Vref_c may be equal to Vref_r. A calibration resistance Rx1 is achieved by a switched capacitor that includes switches SW1 and SW2 and a variable capacitance Cx1. The switches SW1 and SW2 are complementarily turned on and off with sampling clocks φ1 and φ2, respectively. A reference resistance Rref1, a low-pass filter LPF1, and a comparator CP1 are also illustrated.

The output terminal of the operational amplifier OP1 is controlled to be at the reference voltage Vref_c. Accordingly, the variable capacitance Cx1 in the resistance Rx1 to be calibrated is charged toward the voltage Vref_c. And a current resulting from a charge Q charged in the variable capacitance Cx1 is mirrored to a current Ic1'. The current Ic1' is input into the low-pass filter LPF1, and a current Ic1 flows from the low-pass filter LPF1 is supplied to a non-inverting input terminal of the comparator CP1.

Similarly, the output terminal of the operational amplifier OP2 is controlled to be at the reference voltage Vref_r. Accordingly, a current Ir1 flows through the reference resistance Rref1. A current mirrored from the current Ir1, which is equal to the current Ir1 in the exemplary calibration circuit shown in FIG. 1 flows in an inverting input terminal of the comparator CP1. The value of the variable capacitance Cx1 is controlled by an output signal of the comparator CP1 such that the output current Ic1 of the low-pass filter LPF1 and the current Ir1 are the same. Thus the resistance value of the resistance to be calibrated Rx1 is controlled such that Rx1=Rref1. In this way, the capacitance value of the variable capacitance Cx1 is determined.

In various exemplary calibration circuits according to this disclosure, the charge Q charged in the variable capacitance Cx1 in the resistance to be calibrated Rx1 is equal to Vref_c·Cx1. After the completion of charging to the charge Q, no charge is excessively charged in the variable capacitance Cx1. The variable capacitance Cx1 is charged and discharged using the sampling clocks φ1 and φ2 having opposite phases and the same sampling frequency fs.

When the charging and discharging are completed within each cycle of the sampling clocks φ1 and φ2, an amount of charge Q charged during each cycle is constant and not affected by an unbalanced duty ratio of the sampling clocks φ1 and φ2. The charging is performed in a cycle of 1/fs. When the stream of the charge Q is integrated with using the low-pass filter LPF1, the current Ic1 dependent on 1/(Cx1·fs) can be generated accurately.

Similarly, the current Ir1 is generated by applying the reference voltage Vref_r to the reference resistance Rref1. By controlling the currents Ir1 such that the currents Ic1 and Ir1 are the same, a point at which 1/(Cx1·fs)=Rref1=constant can be found. As a result, a stable RC filter can be formed using the stable RC constant independently of the fabrication process and the duty ratio of the sampling clock.

In an actual circuitry, an RC filter is formed on the same semiconductor integrated circuit chip on which the calibration circuit according to this disclosure is formed. It is possible to realize a desired characteristic of the RC filter in the actual circuitry using the result of calibration in the calibration circuit.

That is, for example, the variable capacitance Cx1 of the calibration circuit and a variable capacitance of the RC filter are formed on the same semiconductor integrated circuit chip. The variable capacitance of the RC filter may have the same capacitance value as, or have a capacitance value with a desired ratio to, the capacitance value of the variable capacitance Cx1 of the calibration circuit. When the variable capacitance Cx1 of the calibration circuit is calibrated to have the relationship 1/(Cx1·fs)=Rx1, the variable capacitance of the RC filter is also calibrated to have a desired value.

FIG. 1 illustrates a configuration in which RC time constant is adjusted by adjusting the variable capacitance Cx1 in the resistance Rx1 so as to have a target capacitance value. Alternatively, a variable resistance may be used in adjustment of the time constant. That is, the variable capacitance Cx1 may be replaced with a fixed capacitance, and the reference resistance Rref1 may be replaced with a variable resistance (a resistance to be calibrated). The resistance value of the variable resistance may be controlled using an output signal of the comparator CP1, and the resistance value is adjusted so as to have a target resistance value.

First Embodiment

The first exemplary calibration circuit includes a variable resistance Rx1, which is to be calibrated, and a reference resistance Rref1. The variable resistance Rx1 is constructed as a switched capacitor that includes a variable capacitance Cx1. The variable resistance Rx1 is provided for generating an undulating current. The reference resistance Rref1 is provided for generating a DC current. The first exemplary calibration circuit also includes a reference voltage generating unit configured to produce reference voltages Vref_c and Vref_r, which are used as references for the amounts of the undulating current and the DC current, respectively. The first exemplary calibration circuit further includes a filter configured to average the undulating current, and a comparator.

The undulating current is generated by repeatedly charging the variable capacitance Cx1 in the calibration resistance Rx1 using sampling clocks φ1 and φ2 that has a sampling frequency fs. An amount of the charge that is charged during each cycle of the sampling clock is determined by the reference voltage Vref_c. The DC current is generated by applying the reference voltage Vref_r to the reference resistance Rref1. The undulating current is integrated or averaged through the low-pass filter, and converted to a detection voltage Vc. The detection voltage Vc is compared by the comparator against a voltage that is converted from the DC current. A result of the comparison is fed back for adjustment of the variable capacitance Cx1.

A charge Q required to charge the variable capacitance Cx1 to the reference voltage Vref_c is Cx1·Vref_c. If the variable capacitance Cx1 is fully charged to the reference voltage Vref_c and fully discharged to 0 V in each cycle of the sampling clock having the frequency of fs, an undulating current having an average value of Q·fs=Vref_c·(Cx1·fs) is generated.

Here, in order to accurately generate the current Vref_c·(Cx1·fs), it is necessary to fully charge and fully discharge the variable capacitance Cx1 in charge and discharge phases, respectively, in each cycle of the sampling clock. That is, it is necessary that the time constant of the variable capacitance Cx1 be sufficiently small with respect to a cycle time determined by 1/fs. The filter can be realized by a simple low-pass filter, for example. The filter does not require a high precision.

Similarly, when a voltage Vref_r is supplied between the terminals of the reference resistance Rref1, a DC current passing through it is Vref_r/Rref1. When this DC current and the above-described averaged current are compared and a point where they are the same is found, $$Vref\_c \cdot (C1 \cdot fs) = Vref\_r / Rref1.$$

If, for example, Vref_c=Vref_f, $$Rref1 \cdot C1 \cdot fs = 1.$$

Therefore, the RC time constant can be matched to the sampling frequency fs. The comparison may be between the values of currents or between values of voltages generated from the currents.

An RC time constant of a filter actually used in a circuitry of a semiconductor integrated circuit chip can be calibrated simultaneously with the calibration in the calibration circuit which are also integrated in the same semiconductor integrated circuit chip. For example, a resistance and a variable capacitance having the same values, or physical dimensions, as those of the resistance and the variable capacitance used in the calibration circuit may be used to construct the filter actually used in the circuitry. The variable capacitance that constructs the filter may be set to have the same value as the variable capacitance Cx1 in the calibration circuit determined by the calibration. In this case, the time constant of the filter can be calibrated to 1/fs.

Alternatively, the values, or the physical dimensions, of the resistance and the variable capacitance that construct the filter may be set to have arbitrary ratios to those of the resistance and the variable capacitance in the calibration circuit. For example, when the values of the resistance and the capacitance actually used to construct the filter in a circuitry in a semiconductor integrated circuit chip (different from the low-pass filter LPF1 illustrated in FIG. 1) are R' and C', respectively, and the values of the resistance and the capacitance used in the calibration circuit (Rref1 and Cx1 illustrated in FIG. 1) are R and C, respectively, it may be set as R'=αR, C'=βC.

Further alternatively, it may set as, Vref_c=γVref_r, or the calibration may be made to Ic1=ζIr1, where α, β, γ, and ζ are coefficients indicating ratios. In those cases, it is possible to calibrate the RC time constant of the filter to a value having an arbitrary ratio to 1/fs. In other words, it is not necessary that the sampling clock of the calibration circuit has the same frequency as the cut-off frequency of the filter. For example, a RC time constant of a low-pass filter configured to remove signals in frequencies higher than the Nyquist frequency fs/2, which is widely used in radio frequency communications, can be easily calibrated using a sampling clock having the sampling frequency of fs.

Figure 2:
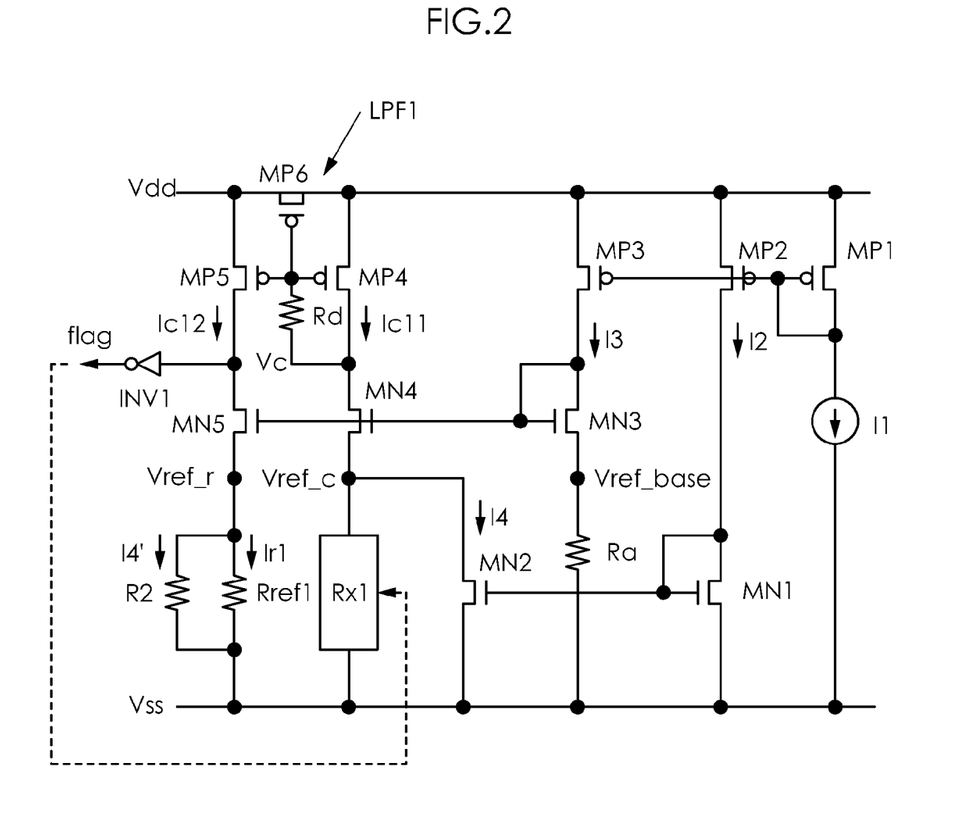
FIG. 2 is a circuit diagram of an RC calibration circuit according to a first embodiment of the present invention.

FIG. 2 illustrates an RC calibration circuit according to a first exemplary calibration circuit according to this disclosure. A current source I1, PMOS transistors MP1 to MP3, NMOS transistors MN1 to MN5, and a resistance Ra constitute a circuitry that generates fixed reference voltages Vref_base, Vref_c, and Vref_r. The current of the current source I1 is mirrored to a current I2 that flows through the transistors MP2 and MN1, and is also mirrored to a current I3 that flows through the transistors MP3 and MN3. Further, the current I2 that flows through the transistor MN1 is mirrored to a current I4 that flows through the transistor MN2.

The reference voltage Vref_base is generated by supplying the current I3 from the transistor MN3 to the resistance Ra. Because gates of the transistors MN4 and MN5 are commonly connected with the gate of transistor MN3, reference voltages Vref_c and Vref_r corresponding to the reference voltage Vref_base are generated at the sources of the transistors MN4 and MN5, respectively.

The transistor MN2 generates a current I4 to be provided to enable the current mirror circuit including transistors MP4 and MP5 to operate stably. Because the resistance to be calibrated Rx1 is a switching capacitor, charging of the resistance Rx1 is not performed continuously. That is, a current that flows from the transistor MP4 into the resistance Rx1 is an undulating current having a saw tooth waveform. If a current that flows through the transistor MP4 is non-continuous, a stable operation of the current mirror circuit including transistors MP4 and MP5 is not performed.

To address this, the transistor MN2 is disposed to draw a constant DC current I4 from the transistor MP4. To cause a current I4' for cancelling the DC current I4 to flow through the transistor MP5, a resistance R2 is connected in parallel to the reference resistance Rref1.

The resistance to be calibrated Rx1 illustrated in FIG. 2 has the same construction as the switched capacitor Rx1 illustrated in FIG. 1. That is, the resistance Rx1 includes a variable capacitance Cx1, a switch SW1 that turns on and off with the sampling clock φ1, and a switch SW2 that turns on and off with the sampling clock φ2. The resistance Rx1 is connected between the source of the transistor MN4 and the ground. The reference resistance Rref1 is connected between the source of the transistor MN5 and the ground.

The current Ic11, which includes the undulating current that flows into the switched capacitor Rx1 and the DC current I4 that flows through the transistor MN2, flows through the transistor MP4. The current mirror circuit mirrors the current Ic11 to generate a current Ic12 that flows through the transistor MP5. The transistors MP5 and MN5 and an inverter INV1 constitute a comparator that corresponds to the comparator CP1 shown in FIG. 1.

The comparator CP1 compares the current Ic12 with a sum of the current Ir1 that flows through the reference resistance Rref1 and the current I4' that flows though the resistance R2. In other words, because the current I4' cancels the current I4 that flows through the transistor MN2, the comparator CP1 compares the current that flows into the switched capacitor Rx1 with the current that flows through the reference resistance Rref1.

When Ic12<Ir1+I4', a detection voltage Vc at the common connection node between the transistors MP5 and MN5 is at L level; when Ic12>Ir1+I4', the detection voltage Vc is at H level. The detection voltage Vc is inverted by the inverter INV1 and a control signal (flag) is obtained. That is, the common connection node between the transistors MP5 and MN5 acts as a sense node and the inverter INV1 acts as a sense amplifier.

When the comparison is completed, the value of the variable capacitance Cx1 in the resistance to be calibrated Rx1 is changed by the control signal, The comparison operation is repeated after the value of the variable capacitance Cx1 is changed, and searching for the value of the variable capacitance Cx1 continues. Here, the mirror ratio of the current mirror circuit is selected so that the current Ic12 become equal to the current Ir1+I4' when the current that flows into the switched capacitor Rx1 is equal to the current that flows through the reference resistance Rref1. Accordingly, when a state that Ic12=Ir1+I4' is found, the capacitance value of the variable capacitance Cx1 that satisfies the condition of 1/(Cx1·fs)=Rref1 is determined.

A gate capacitance of a PMOS transistor MP6 and a resistance Rd constitute a low-pass filter LPF1. The non-continuous current Ic11 generated by the charge Q that charges the variable capacitance Cx1 (see FIG. 1) is leveled by the low-pass filter LPF1 and is mirrored to the DC current Ic12 that flows through the transistor MP5. It is noted that the repeating cycle of the comparison and changing of the value of the variable capacitance Cx1 is required to be sufficiently longer than the time constant of this low-pass filter LPF1.

Figure 3:
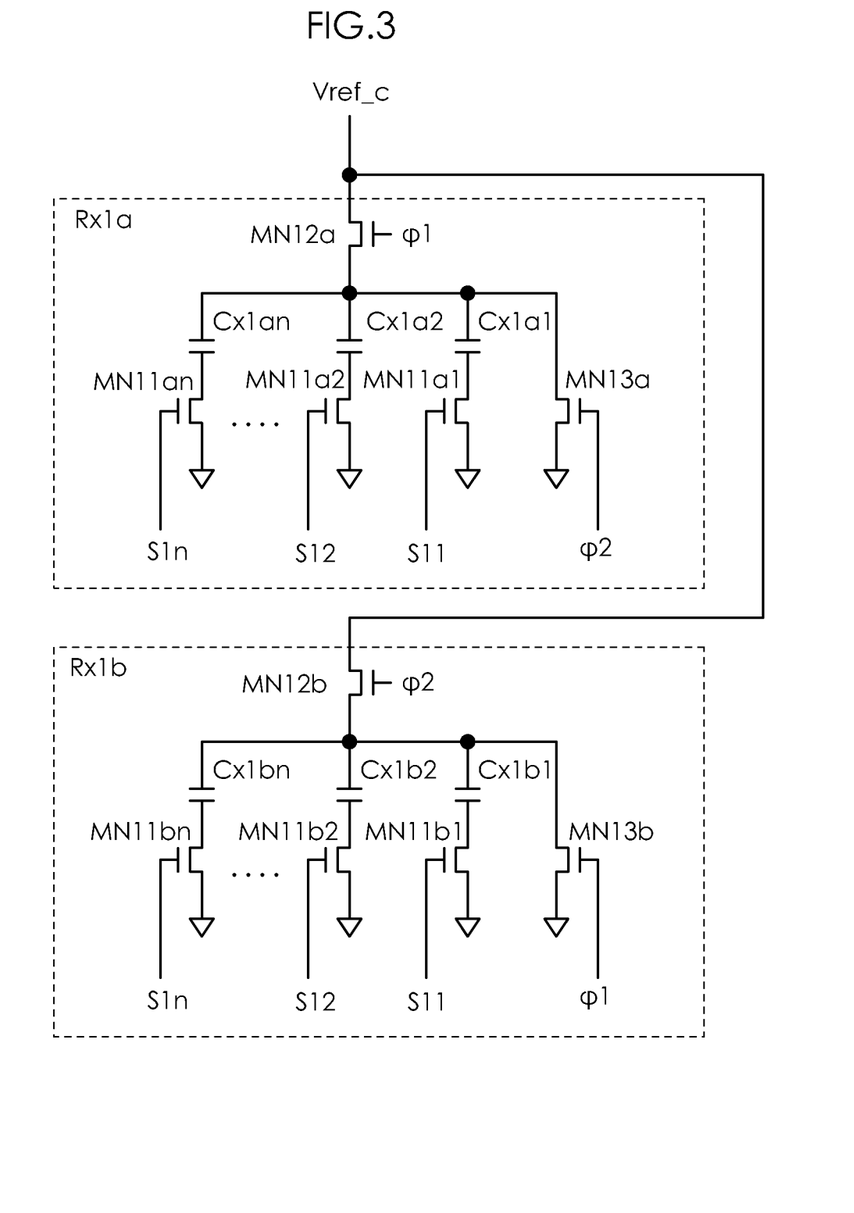
FIG. 3 is a specific circuit diagram of a calibration resistance in the RC calibration circuit illustrated in FIG. 2.

FIG. 3 illustrates an exemplary configuration of the resistance to be calibrated Rx1. The resistance Rx1 is constructed with two resistances Rx1a and Rx1b that operate complementarily. The resistance Rx1a includes n fixed capacitances Cx1a1 to Cx1an, which are connected in series to respective NMOS transistors MN11a1 to MN11an that operate as capacitance selection switches. The resistance Rx1a further includes an NMOS transistor MN12a that operates as a charging switch and an NMOS transistor MN13a that operates as a discharging switch. The NMOS transistors MN12a and MN13a turn on and off with the sampling clocks φ1 and φ2, respectively.

The resistance Rx1b includes n fixed capacitances Cx1b1 to Cx1bn, which are connected in series to respective NMOS transistors NM11b1 to MN11bn that operate as capacitance selection switches. The resistance Rx1b further includes an NMOS transistor MN12b that operates as a charging switch, and an NMOS transistor MN13b that operates as a discharging switch. The NMOS transistors MN12b and MN13b turn on and off with the sampling clocks φ2 and φ1, respectively.

As described above, the fixed capacitances Cx1a1 to Cx1an and Cx1b1 to Cx1bn are charged and discharged complementarily. This aims to increase the phases during which the charge Q is charged and the current Ic11 flows into the resistance Rx1. Thereby, a variation in voltage caused by the undulating current Ic11 is suppressed. The selection switches in the resistances Rx1a and Rx1b are commonly controlled by control signals S11 to S1n in accordance with the comparison result (output logic of the inverter INV1). Thereby, the number of connections in the fixed capacitances Cx1a1 to Cx1an and Cx1b1 to Cx1bn, and the value of the capacitances Cx1a and Cx1b are selected.

Sampling, or charging and discharging, of the resistance to be calibrated Rx1 is performed complementarily. Accordingly, the resistance to be calibrated Rx1 is sampled, i.e., charged and discharged, twice in each cycle of the sampling clocks φ1 and φ2, while keeping the impedance of the resistance Rx1 the same. In other words, the sampling is performed with an equivalent sampling frequency of 2·fs. As a result, the current generated by charging the calibration resistance Rx1 increases to Ic11=2·Cx1·Vref_c·fs.

Figure 4:
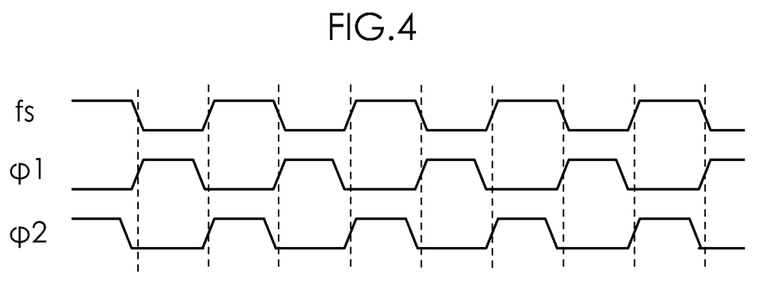
FIG. 4 illustrates waveforms of clocks used in the first embodiment.

The sampling clocks φ1 and φ2 may preferably be generated such that their charging and discharging phases do not overlap each other, as illustrated in FIG. 4. That is, in this is because, if there is a time period when charging and discharging are performed at the same time in transition of the sampling clocks φ1 and φ2, the charge Q is unable to be properly generated.

Figure 5:
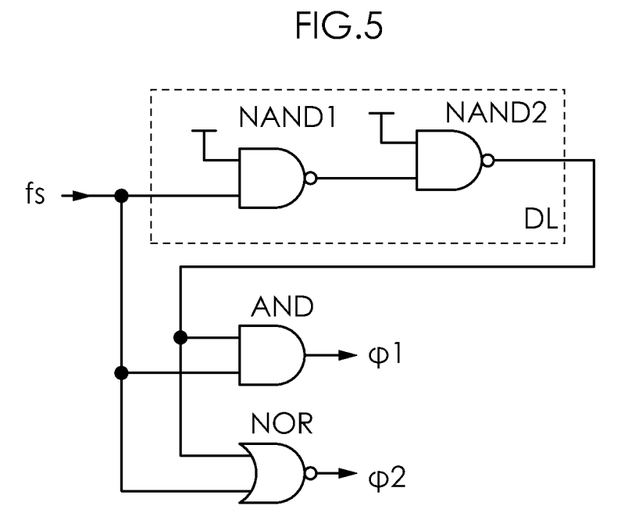
FIG. 5 is a circuit diagram of a circuit that produces clocks used in the first embodiment.

Specifically, with the configuration illustrated in FIG. 5, for example, the sampling clocks φ1 and φ2 can be generated. In FIG. 5, NAND circuits NAND1 and NAND2 form a delay circuit DL configured to delay the sampling clock having the sampling frequency fs, an AND circuit AND outputs the sampling clock φ1, and a NOR circuit NOR outputs the sampling clock φ2.

As previously described, when a switched capacitor is provided as a reference to calibrate a value of a variable resistance, each the fixed capacitances Cx1a1 to Cx1an and Cx1b1 to Cx1bn may be a single fixed capacitance.

To enhance understanding, the calibration circuit illustrated in FIG. 2 is described below using specific values of various elements. That is, for example, the mirror ratios are MP1:MP2:MP3=1:1:1, MP4:MP5=2:1, MN1:MN2=1:4, and MN3:MN4:MN5=1:4:4. The capacitance of the transistor MP6 is 1.6 pF, the resistance Rd is 5 kΩ, the reference resistance Rref1 is 2500Ω, the resistance R2 is 2500Ω, the resistance Ra is 5 kΩ, and the sampling frequency fs is 100 MHz.

The current I1 of 100 µA is mirrored as the currents I2 and I3 of 100 µA that flow through the transistors MP1 to MP3. The current mirror circuit constructed with the transistors MN1 and MN2 further mirrors the current I2 is to the current I4 of 400 µA. The current I4 is drawn from the node between the transistor MN4 and the resistance to be calibrated Rx1.

The resistance Ra generates the reference voltage Vref_base of I3×Ra=500 mV. Accordingly, the gate voltage of the transistor MN3 is 500 mV+Vth_MN3 (Vth_MN3 is the threshold of the transistor MN3). The gate of transistor MN4 is commonly connected with the gate of the transistor MN3. Further, dimensions of these transistors are selected to correspond to amounts of the currents flows in respective transistors. Accordingly, a reference voltage Vref_c equal to the reference voltage Vref_base is generated at the source of the transistor MN4. Similarly, a reference voltage Vref_r equal to the reference voltage Vref_base is generated at the source of the transistor MN5 when the state that Ic12=Ir1+I4' is established.

Before switching by the switches SW1 and SW2 start, i.e., before charging and discharging of the variable capacitance Cx1 in the resistance Rx1 start, no current flows into the switched capacitor Rx1. Accordingly, only the current I4 flows through the transistor MP4. Further, because the mirror ration is MP4:Mp5=2:1, a current Ic12=400 mA×½=200 µA flows through the transistors MP5, MN5, and through the resistances Rref1 and R2, which are connected in parallel to each other. Accordingly, a voltage of 200 µA×1250 Ω=250 mV, which is lower than the reference voltage Vref_base, is generated at the source of the transistor MN5. As a result, the detection voltage Vc becomes L level.

Then, the switch SW1 that supplies the reference voltage Vref_c=500 mV to charge the variable capacitance Cx1 in the calibration resistance Rx1 and the switch SW2 that supplies the ground voltage of 0V to the variable capacitance Cx1 start to operate at fs=100 MHz. The variable capacitance Cx1 is assumed to have the configuration illustrated in FIG. 3, and the capacitance value can be switched by the control signal S11 to S1n between 3.5 pF and 4.5 pF in 100 steps.

First, Cx1 is set to 3.5 pF. The capacitances Cx1a and Cx1b in the resistance Rx1a are charged twice in 1/fs=10 ns, and thus Ic11=400 µA+350 µA flows through the transistor MP4. This current is averaged by the low-pass filter LPF1 and mirrored to Ic12=200 µA+175 µA. The current Ic12 flows into the node between the transistors MP5 and MN5. Accordingly, a voltage of Rref1//R2×Ic12=1250Ω×375 µA=468.75 mV, which is lower than Vref_base is generated at the source of the transistor MN5. Here, "Rref1//R2" designates a resistance including the reference resistances Rref1 and the resistance R2 that are connected in parallel to each other. As a result, the detection voltage Vc remains at L level.

The detection voltage Vc is preferably be sensed after the current Ic11 is sufficiently stabilized. That is, Vc is preferably be sensed after a stabilizing period that is sufficiently longer that the time constant of the low-pass filter LPF1 of 5 kΩ×1.6 pF=8 ns. For example, Vc may be sensed after about 80 ns.

In this exemplary calibration circuit, the variable capacitance Cx1 is at most 4.5 pF. Because the clocks φ1 and φ2 is 100 MHz, it is necessary to charge the capacitance in a charging period, i.e., ½ cycle=5 ns. Further, considering the variation in the duty ratio and the capacitance, it is preferable to set the impedance of the charging path to have a time constant of, for example, 3 ns or less. That is, the resistance of the charging path should preferably be less than about 667 Ω.

In fact, however, the capacitance is charged only to 63% of the reference voltage when the time constant is equal to the charging period. Therefore, it is preferable to set the time constant of the charging path to less than 10% of the charging period. Thus, the impedance of the charging path including on resistance of the switch SW1 may be set to 66.7Ω or less.

In practice, it is easy to realize the switch SW1 having on resistance less than this value by using a MOS transistor integrated in a semiconductor integrated circuit. Accordingly, the feasibility of the calibration circuit according to this exemplary calibration circuit is high.

FIGS. 12A, 12B and FIGS. 13A, 13B illustrate charging and discharging of a capacitance in a conventional technique and in an exemplary calibration circuit according to this disclosure, respectively, when the duty ratio of a clock is changed.

Figure 12A:
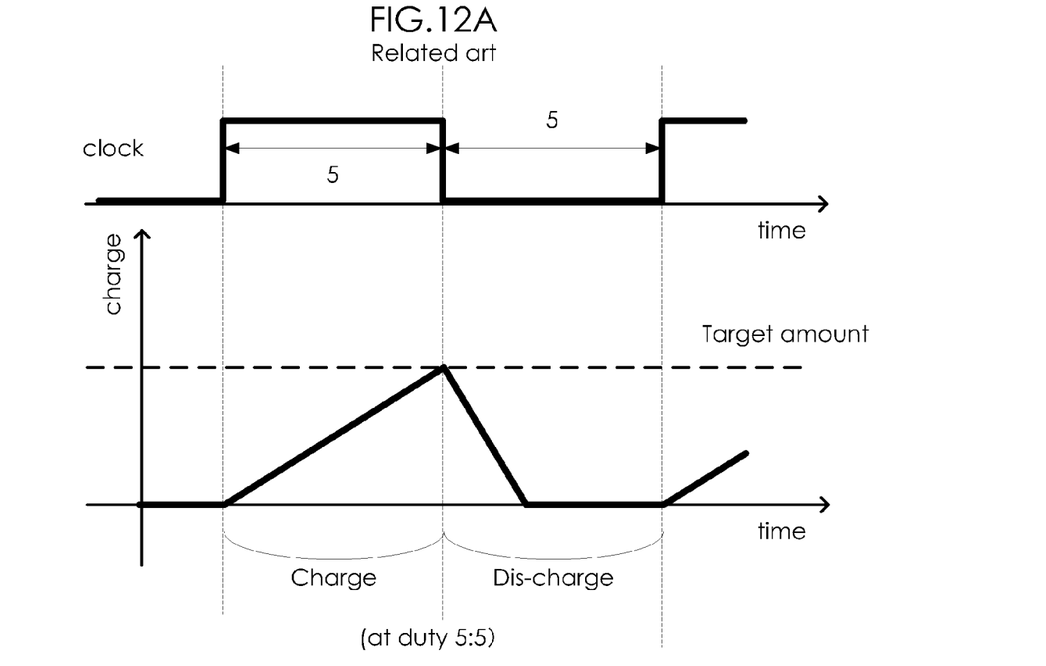
FIGS. 12A and 12B are illustrations for describing charging and discharging in the RC calibration circuits in the first and second conventional arts.
Figure 12B:
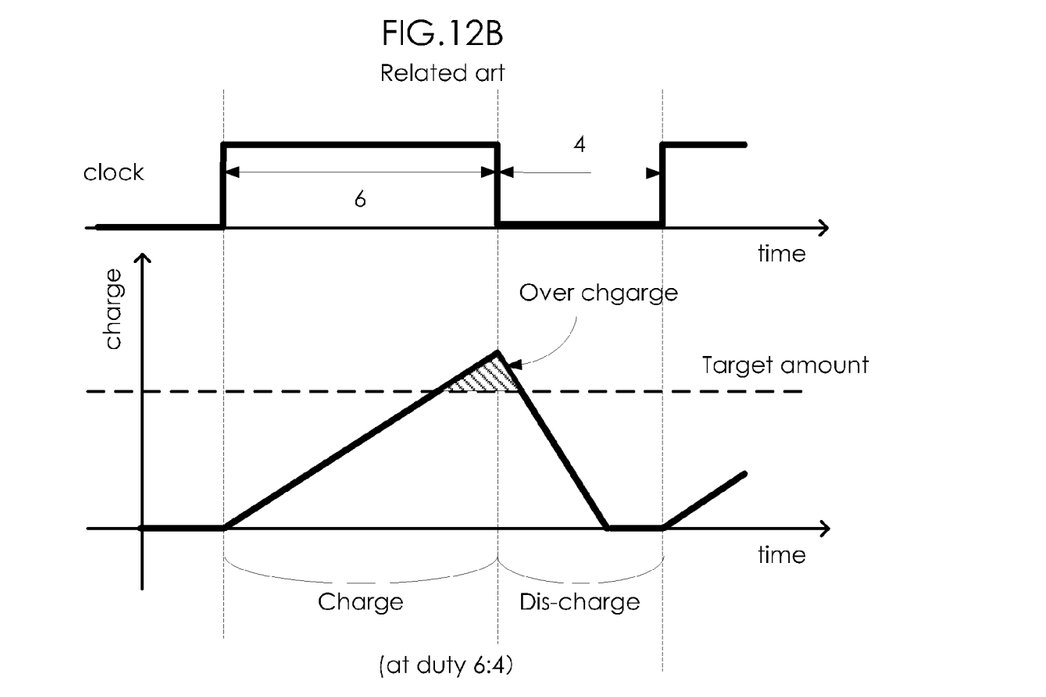

FIGS. 2, 12A and 12B illustrate the conventional technique shown in FIG. 10 when the duty ratio of clocks is 5:5 and 6:4, respectively. In each of the drawings, a clock used for controlling charging and an amount of charge charged in a capacitance is shown. Specifically, during a charge period while the clock is in H level, the capacitance is charged and the charge in capacitance increases. During a discharge period while the clock in L level, on the other hand, the capacitance is discharged and the charge in the capacitance decreases.

In the conventional art, because a constant current source is used in charging, if the duty ratio is changed, the amount of charge charged during the charging period changes. That is, if the duty ratio is changed from 5:5 to 6:4 and the charging period is lengthened, an overcharging occurs and the amount of charge increases. Although not illustrated, if the charging time is shortened, the charging becomes insufficient and the amount of charge decreases.

Figure 13A:
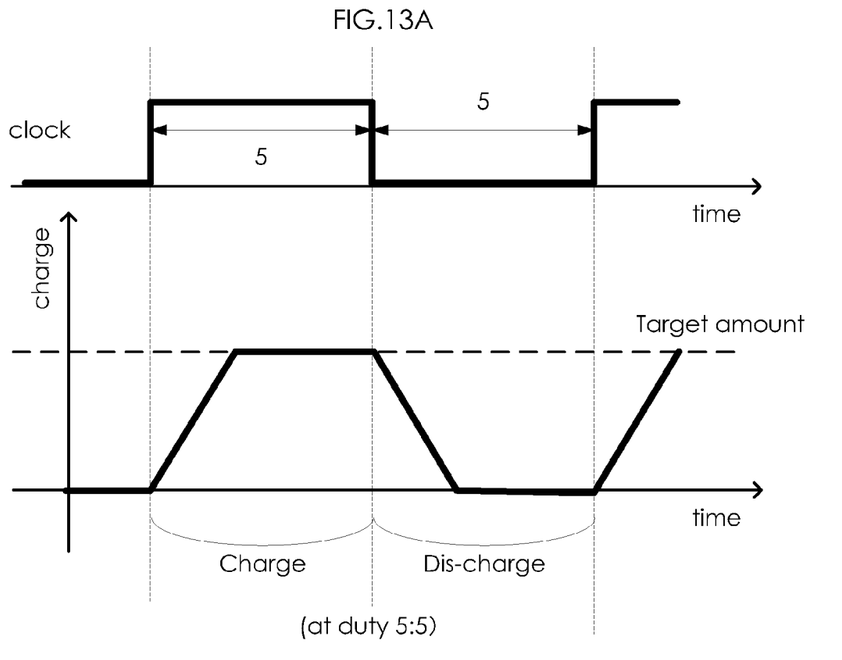
FIGS. 13A and 13B are illustrations for describing charging and discharging in the RC calibration circuit in the present invention.
Figure 13B:
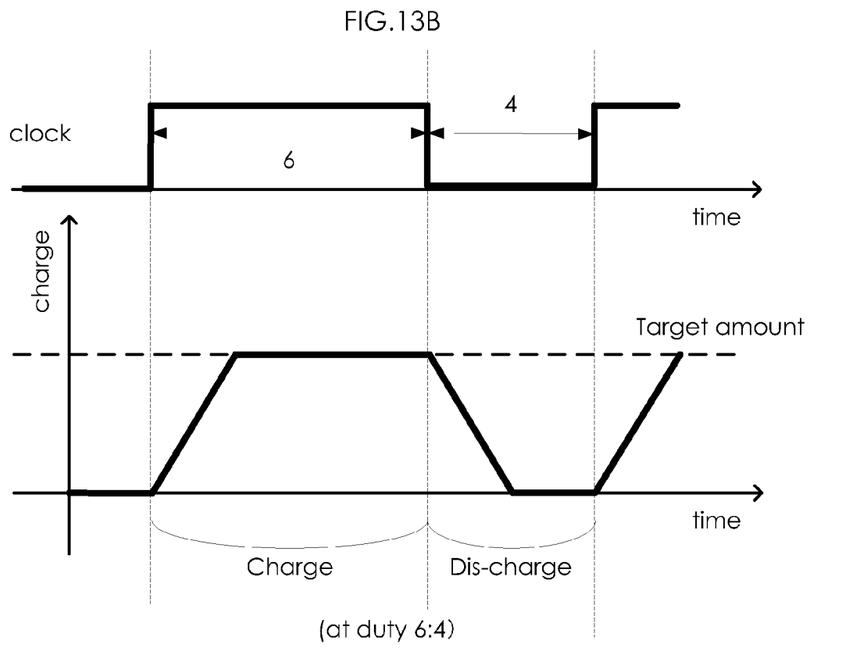

In contrast, in the exemplary calibration circuit shown in FIG. 1, first, a constant voltage $V_{ref\_c}$ is supplied to the capacitance during the charge period and, second, a time constant of the charging path is set to be sufficiently shorter than the charge period. Accordingly, the capacitance is charged to a target amount of charge, which is determined by the reference voltage $V_{ref\_c}$ and the value of the capacitance, within a period shorter than the charging period and no overcharging occurs. Thus, the amount of charge during each cycle of the clock is determined independently of the duty ratio of the clock, and an accurate calibration can be achieved.

When one cycle of evaluation is completed and no change occurs in the flag, the control signal S11 to S1$n$ changes and the next cycle of evaluation is made. In an exemplary calibration circuit, the control signal is incremented in every cycle of the evaluation and the capacitance value of the capacitance Cx1 increases linearly. When the flag moves from H level to L level, the RC value at which $Rref1 \cdot Cx1 \cdot fs$=constant value is determined.

Through sequential evaluations, Ic11 increases from 400 µA+350 µA to 400 µA+360 µA, 400 µA+370 µA, .... When Cx1 increases to 4 pF, Ic11 increases to 400 µA+400 µA and the voltage at the node between the transistor MN5 and the reference resistance Rref1 increases to Rref1//R2× Ic12=1250Ω×400 µA=500 mV. That is, the current Ic12 matches the current Ir1+I4' and the voltage at the node between the transistor MN5 and the reference resistance Rref1 becomes equal to the reference voltage $V_{ref\_base}$. When the capacitance value of the variable resistance Cx1 further increases, the current Ic12 exceeds the current Ir1+I4' and the detection voltage Vc moves to H level. As a result, the flag moves to L level, and the comparative evaluation is completed.

In the exemplary calibration circuit above-described, the flag inverts when the RC constant becomes to Rref1× Cx1=2500Ω×4 pF=10 ns, or the corresponding frequency fp=1/(2πRref1·Cx1) becomes to 15.9 MHz. Even if values of the reference resistance Rref1 and the variable capacitances Cx1$a$ and Cx1$b$ vary due to variations in the fabrication process of the semiconductor integrated circuit, the exemplary calibration circuit can calibrate such that Rref1×Cx1× fs=constant. That is, the exemplary calibration circuit can achieve the calibration that is not affected by the variations in process.

In addition, because resistances and capacitances forming various components such as a filter that are actually used in a circuitry of the semiconductor integrated circuit are disposed in the same semiconductor chip in which the reference resistance Rref1 and the variable capacitance Cx1 forming the calibration circuit are disposed. Accordingly, the resistances and capacitances forming the components used in the circuitry are affected by the variations in process in common with the reference resistance Rref1 and the variable capacitance Cx1. Therefore, adjustment based on a result of calibration performed by the calibration circuit avoids the RC time constant of the components in the circuitry from being affected by the variations in process.

Second Exemplary Embodiment

Figure 6:
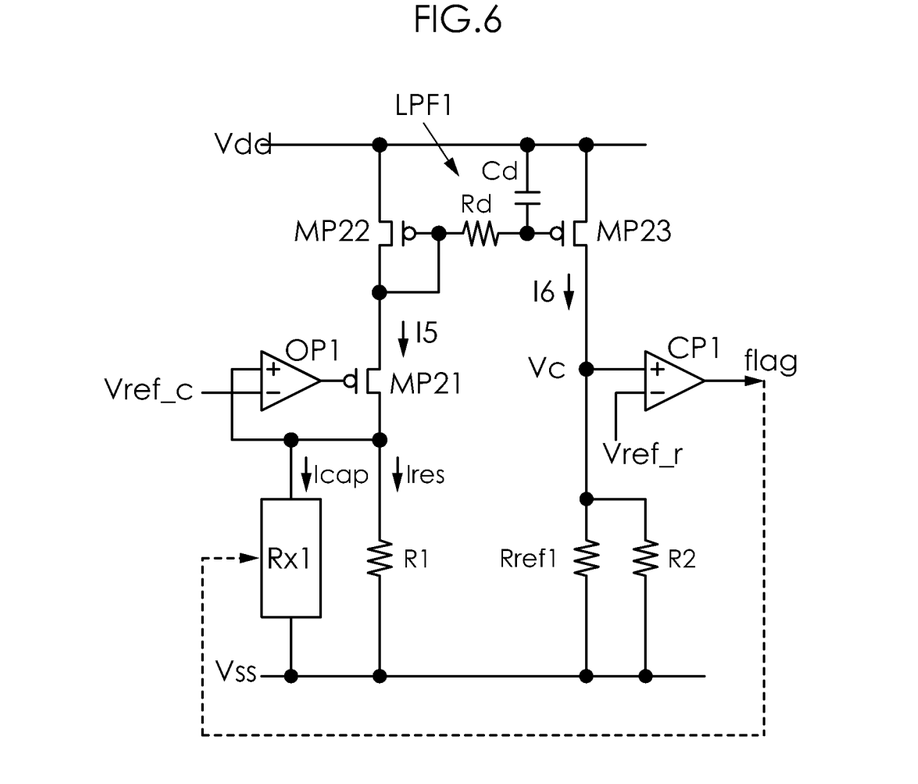
FIG. 6 is a circuit diagram of an RC calibration circuit according to a second embodiment of the present invention.

FIG. 6 illustrates a second exemplary calibration circuit according to this disclosure. The reference voltage $V_{ref\_c}$ is input to an inverting input terminal of an operational amplifier OP1. An output terminal of the operational amplifier OP1 is connected to the gate of a PMOS transistor MP21. The voltage in the drain of the transistor MP21 is input to the non-inverting input terminal, and thus the non-inverting input terminal is controlled so as to be at the reference voltage $V_{ref\_c}$.

The source of the transistor MP21 is connected to a current mirror circuit including transistors MP22 and MP23. The current mirror circuit further includes a low-pass filter LPF1 configured with a capacitance Cd and a resistance Rd. The drain of the transistor MP23 is connected to the reference resistance Rref1 and the non-inverting input terminal of the comparator CP 1. A reference voltage $V_{ref\_r}$ is input to the inverting input terminal of the comparator CP1. A resistance R1, which generates a DC current, is provided to ensure a stable operation of the operational amplifier OP1, as in the case of the transistor MN2 illustrated in FIG. 2. To cancel the DC current generated by the resistance R1, a resistance R2 is connected in parallel to the reference resistance Rref1, as in the case of the first exemplary calibration circuit.

In the second embodiment, a current I5, which is a sum of a DC current Ires generated by supplying the reference voltage $V_{ref\_c}$ to the resistance R1 and an undulating current Icap generated by charging the variable capacitance Cx1 in the calibration resistance Rx1 using the reference voltage $V_{ref\_c}$, flows through the transistors MP21 and MP22. The current I5 is integrated and averaged by the low-pass filter LPF1, and a current I6=K (Ires+Icap_integ) that flows through the transistor MP23 is generated. Here, Icap_integ denotes a current in which Icap is integrated and K denotes the mirror ratio between the transistors MP22 and MP23. The current I16 flows through the reference resistance Rref1 and the resistance R2.

The detection voltage Vc is determined by comparing the current I6 with a sum of the currents that flow through the reference resistance Rref1 and resistance R2. The detection voltage Vc is compared against the reference voltage $V_{ref\_r}$ by the comparator CP1. That is, in the second exemplary calibration circuit, the comparator CP1 is used as a sense amplifier. Depending on a result of the comparison, the capacitance value of the variable capacitance Cx1 in the resistance Rx1 is changed.

Third Embodiment

Figure 7:
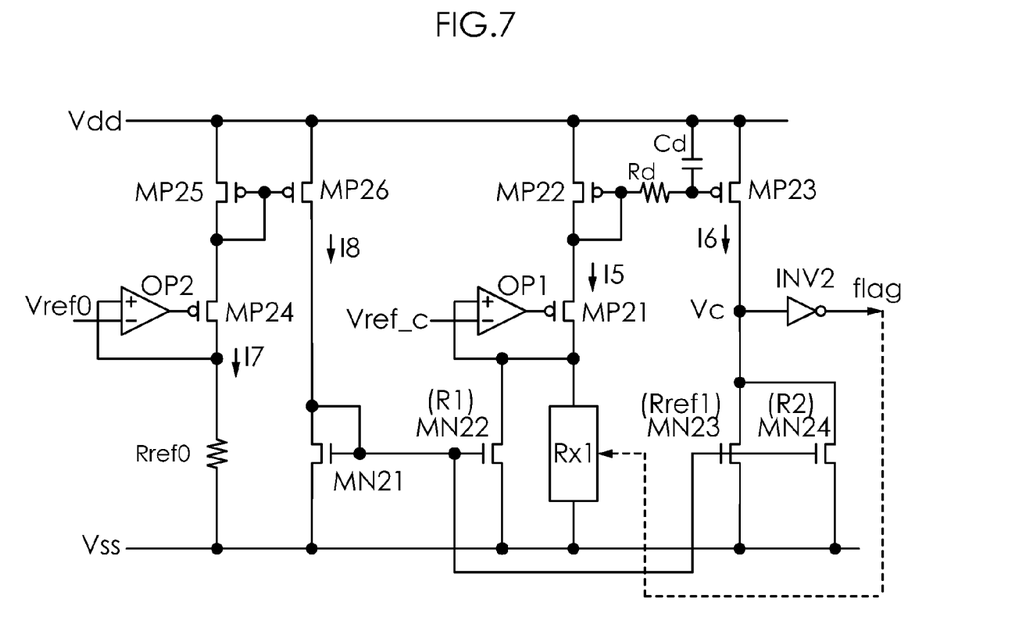
FIG. 7 is a circuit diagram of an RC calibration circuit according to a third embodiment of the present invention.

FIG. 7 illustrates a third exemplary calibration circuit according to this disclosure. The same reference numerals are used in the same element as in FIG. 6. A reference voltage Vref0 is input to an inverting input terminal of an operational amplifier OP2. An output terminal of the operational amplifier OP2 is connected to the gate of a PMOS transistor MP24. The voltage in the drain of the transistor MP24 is input to an non-inverting input terminal of the operational amplifier OP2, and thus the non-inverting input terminal is controlled so as to be at the reference voltage Vref0.

A DC current I7 generated by applying the reference voltage Vref0 to a reference resistance Rref0 is mirrored by a current mirror circuit including PMOS transistors MP25 and MP26. The mirrored current I8 flows through the transistors MP26 and MN21. The NMOS transistor MN21 forms another current mirror circuit with an NMOS transistor MN22. In the third exemplary calibration circuit, the transistor MN22, which is connected to the non-inverting input terminal of the operational amplifier OP1, corresponds to the resistance R1 in the second exemplary calibration circuit.

The NMOS transistor MN21 further forms a current mirror circuit with transistors MN23 and MN24. The transistors MN23 and MN24 correspond to the reference resistance Rref1 and the resistance R2, respectively, in the second exemplary calibration circuit. The drain of the transistor MP23, which forms a current mirror circuit with the transistor MP22, is connected to drains of the transistors MN23 and MN24.

An inverter INV2 identifies whether the detection voltage Vc at the node between the drains of the transistors MN23 and MP23 is in H level or in L level. An output of the inverter INV2 is used to adjust the variable capacitance Cx1 in the resistance to be calibrated Rx1, as in the case of the second exemplary calibration circuit.

The second embodiment (FIG. 6) and the third embodiment (FIG. 7) are different from the first embodiment (FIGS. 1, 2) in the location of the resistance Rd in the low-pass filter. The resistance Rd is connected between the commonly connected gates of the transistors MP5 and MP4 and the drain of the transistor MP4 in the first embodiment. In contrast, the resistance Rd is disposed between the gate of the transistor MP22 and the gate of the transistor MP23 in the second and third embodiments.

What is claimed is:

1. A calibration circuit, comprising:
a switched capacitor including a first capacitance, a charging switch that supplies a first constant voltage to the first capacitance, and a discharging switch that supplies a first reference voltage to the first capacitance, wherein:
the switched capacitor is supplied with a sampling clock having a sampling frequency so that the charging and discharging switches alternately supply the first constant voltage for a charging period during which a charging current flows into the first capacitance and the first reference voltage for a discharging period in each cycle of the sampling clock such that the first capacitance is effectively charged to the first constant voltage during the charging period and effectively discharged to the first reference voltage during the discharging period;
an averaging circuit that averages the charging current to generate a first current;
a first resistance to which a second constant voltage is supplied so that a second current flows; and
a comparing circuit that compares the first current and the second current to generate a comparison result; and
an adjusting circuit that adjusts a value of one of the first resistance and the first capacitance in accordance with the comparison result,
wherein the averaging circuit includes a current mirror circuit including an input-side transistor through which the charging current flows and an output-side transistor having a source connected in common with a source of the input-side transistor.

2. The calibration circuit of claim 1, wherein the adjusting circuit adjusts such that a difference between the first current and the second current is decreased.

3. The calibration circuit of claim 1, wherein:
the averaging circuit further includes a low-pass filter that supplies a filtered gate voltage to a gate of the output-side transistor so that the output-side transistor generates the first current, wherein the low-pass filter includes a second capacitance connected between a second reference voltage and the gate of the output-side transistor and a second resistance connected between one of:
(i) a gate of the input-side transistor, which is connected in common with the gate of the output-side transistor, and a drain of the input-side transistor; and
(ii) the gate of the output-side transistor and a gate of the input-side transistor, which is connected in common with a drain of the input-side transistor.

4. The calibration circuit of claim 3, wherein:
the averaging circuit includes a bypass current source that generates a constant bypass current, the bypass current bypasses the switched capacitor such that both of the charging current and the bypass current flow through the input-side transistor; wherein the current mirror circuit averages a sum of the charging current and the bypass current and generates the first current; and
the comparing circuit includes a cancel current source that generates a cancel current corresponding to the bypass current such that the comparing circuit compares the first current and a sum of the second current and the cancel current.

5. The calibration circuit of claim 1, wherein:
the first capacitance includes a third capacitance and a fourth capacitance, the charging switch includes a first charging switch that supplies the first constant voltage to the third capacitance and a second charging switch that supplies the first constant voltage to the fourth capacitance, and the discharging switch includes a first discharging switch that supplies the first reference voltage to the third capacitance and a second discharging switch that supplies the first reference voltage to the fourth capacitance;
the first charging and discharging switches alternately supply the first constant voltage for a first charging period during which the charging current flows into the third capacitance and the first reference voltage for a first discharging period; and
the second charging and discharging switches alternately supply the first constant voltage for a second charging period, which is within the first discharging period, during which the charging current flows into the fourth capacitance and the first reference voltage for a second discharging period.

6. A semiconductor integrated circuit, comprising:
a circuitry including a circuit capacitance and a circuit resistance that determine an RC time constant of the circuitry, and a calibration circuit comprising:
a switched capacitor including a first capacitance, a charging switch that supplies a first constant voltage to the first capacitance, and a discharging switch that supplies a first reference voltage, wherein:
the switched capacitor is supplied with a sampling clock having a sampling frequency so that the charging and discharging switches alternately supply the first constant voltage for a charging period during which a charging current flows into the first capacitance and the first reference voltage for a discharging period in each cycle of the sampling clock such that the first capacitance is effectively charged to the first constant voltage during the charging period and effectively discharged to the first reference voltage during the discharging period;
an averaging circuit that averages the charging current to generate a first current;
a first resistance to which a second constant voltage is supplied so that a second current flows; and
a comparing circuit that compares the first current and the second current to generate a comparison result; and
an adjusting circuit that adjusts a calibration value, which is a value of one of the first resistance and the first capacitance, in accordance with the comparison result, the adjusting circuit further adjust a circuit value, which is a value of the circuit resistance when the calibration value is the value of the first resistance and a value of the circuit capacitance when the calibration value is the value of the first capacitance, such that a ratio between the calibration value and the circuit value is kept constant,
wherein the averaging circuit includes a current mirror circuit including an input-side transistor through which the charging current flows and an output-side transistor having a source connected in common with a source of the input-side transistor.

7. The semiconductor integrated circuit of claim 6, wherein the adjusting circuit adjusts such that a difference between the first current and the second current is decreased.

8. The semiconductor integrated circuit of claim 6, wherein the circuit capacitance and the first capacitance are simultaneously formed on a chip of the semiconductor integrated circuit and the circuit resistance and the first resistance are simultaneously formed on the chip.

9. The semiconductor integrated circuit of claim 6, wherein:
the averaging circuit further includes a low-pass filter that supplies a filtered gate voltage to a gate of the output-side transistor so that the output-side transistor generates the first current, wherein the low-pass filter includes a second capacitance connected between a second reference voltage and the gate of the output-side transistor and a second resistance connected between one of:
(i) a gate of the input-side transistor, which is connected in common with the gate of the output-side transistor, and a drain of the input-side transistor; and
(ii) the gate of the output-side transistor and a gate of the input-side transistor, which is connected in common with a drain of the input-side transistor.

10. The semiconductor integrated circuit of claim 9, wherein:
the averaging circuit includes a bypass current source that generates a constant bypass current, the bypass current bypasses the switched capacitor such that both of the charging current and the bypass current flow through the input-side transistor, wherein the current mirror circuit averages a sum of the charging current and the bypass current and generates the first current; and
the comparing circuit includes a cancel current source that generates a cancel current corresponding to the bypass current such that the comparing circuit compares the first current and a sum of the second current and the cancel current.

11. The semiconductor integrated circuit of claim 6, wherein:
the first capacitance includes a third capacitance and a fourth capacitance, the charging switch includes a first charging switch that supplies the first constant voltage to the third capacitance and a second charging switch that supplies the first constant voltage to the fourth capacitance, the discharging switch includes a first discharging switch that supplies the first reference voltage to the third capacitance and a second discharging switch that supplies the first reference voltage to the fourth capacitance;
the first charging and discharging switches alternately supply the first constant voltage for a first charging period during which the charging current flows into the third capacitance and the first reference voltage for a first discharging period; and
the second charging and discharging switches alternately supply the first constant voltage for a second charging period, which is within the first discharging period, during which the charging current flows into the fourth capacitance and the first reference voltage for a second discharging period.

12. A calibration method, comprising:
providing a switched capacitor including a first capacitance, a charging switch that supplies a first constant voltage to the first capacitance, and a discharging switch that supplies a first reference voltage to the first capacitance;
supplying a sampling clock having a sampling frequency to the switched capacitor such that the charging and discharging switches alternately supply the first constant voltage for a charging period during which a charging current flows into the first capacitance and the first reference voltage for a discharging period in each cycle of the sampling clock such that the first capacitance is effectively charged to the first constant voltage during the charging period and effectively discharged to the reference voltage during the discharging period;
averaging the charging current to generate a first current;
supplying a second constant voltage to a first resistance so that a second current flows through the first resistance;
comparing the first current and the second current to generate a comparison result; and
adjusting a value of one of the first resistance and the first capacitance in accordance with the comparison result,
wherein the averaging includes an averaging circuit, and wherein the averaging circuit includes a current mirror circuit including an input-side transistor through which the charging current flows and an output-side transistor having a source connected in common with a source of the input-side transistor.

13. The method of claim 12, wherein the adjusting adjusts such that a difference between the first current and the second current is decreased.

14. The method claim 12, wherein:
the averaging includes generating a constant bypass current that bypasses the switched capacitor such that the averaging averages a sum of the charging current and the bypass current to generates the first current; and
the comparing includes generating a cancel current corresponding to the bypass current such that the comparing compares the first current and a sum of the second current and the cancel current.

15. The method of claim 12, wherein:
- the providing provides switched capacitor such that the first capacitance includes a third capacitance and a fourth capacitance, the charging switch includes a first charging switch that supplies the first constant voltage to the third capacitance and a second charging switch that supplies the first constant voltage to the fourth capacitance, and that the discharging switch includes a first discharging switch that supplies the first reference voltage to the third capacitance and a second discharging switch that supplies the first reference voltage to the fourth capacitance;
- the first charging and discharging switches alternately supply the first constant voltage for a first charging period during which the charging current flows into the third capacitance and the first reference voltage for a first discharging period; and
- the second charging and discharging switches alternately supply the first constant voltage for a second charging period, which is within the first discharging period, during which the charging current flows into the fourth capacitance and the first reference voltage for a second discharging period.

* * * * *